United States Patent
Bailey et al.

(10) Patent No.: US 7,638,106 B2
(45) Date of Patent: Dec. 29, 2009

(54) METHOD OF TREATING A GAS STREAM

(75) Inventors: Christopher Mark Bailey, Horsham (GB); Michael Andrew Galtry, Worthing (GB); David Engerran, Arundel (GB); Andrew James Seeley, Bristol (GB); Geoffrey Young, Weston-super-Mare (GB); Michael Alan Eric Wilders, Horsham (GB); Kenneth Allen Aitchison, Los Gatos, CA (US); Richard A. Hogle, Oceanside, CA (US)

(73) Assignee: Edwards Limited, Crawley, West Sussex (GB)

( * ) Notice: Subject to any disclaimer, the term of this patent is extended or adjusted under 35 U.S.C. 154(b) by 254 days.

(21) Appl. No.: 11/409,143

(22) Filed: Apr. 21, 2006

(65) Prior Publication Data

US 2007/0248516 A1 Oct. 25, 2007

(51) Int. Cl.
*B01D 53/34* (2006.01)
*B01D 53/38* (2006.01)
(52) U.S. Cl. .................................................. 423/210
(58) Field of Classification Search ................ 423/210
See application file for complete search history.

(56) References Cited

U.S. PATENT DOCUMENTS

| | | | | |
|---|---|---|---|---|
| 4,444,734 | A * | 4/1984 | Mastrup et al. | 423/210 |
| 5,192,514 | A | 3/1993 | Dismukes | |
| 5,298,227 | A * | 3/1994 | Hirth et al. | 423/1 |
| 5,662,872 | A * | 9/1997 | Shimada et al. | 423/236 |
| 6,206,970 | B1 | 3/2001 | Atwell | |
| 6,530,977 | B2 * | 3/2003 | Seeley et al. | 95/149 |

FOREIGN PATENT DOCUMENTS

| | | |
|---|---|---|
| JP | 3-253571 | 11/1991 |
| JP | 2000024453 | 1/2000 |
| JP | 2000-176308 | 6/2000 |
| JP | 2000254444 | 9/2000 |

OTHER PUBLICATIONS

Mochizuki Yoshihiko, Hirano Mitsugi; Abstract of JP 2000176308 A, "Dry Electric Dust Collector and Flue Thereof," Jun. 27, 2000; Hitachi Plant Eng & Constr Co.
Sugimoto Kinya; Abstract of JP 3253571A, "Discharge Device and Chemical Vapor Growth Device," Nov. 12, 1991; Hitachi Ltd; Hitachi Tokyo Electronics.
United Kingdom Search Report Transmittal Letter dated Feb. 2, 2007, for Application No. GB 0616004.8.
United Kingdom Search Report for Application No. GB 0616004.8; Claims searched: 1-5; Date of search: Feb. 1, 2007.
Transmittal Letter of United Kingdom Search Report of Application No. GB 0610978.9 mailed Oct. 18, 2006.
United Kingdom Search Report of Application No. GB 0610978.9; Claims searched: 1-33; Date of Search: Oct. 17, 2006.

* cited by examiner

*Primary Examiner*—Timothy C Vanoy
(74) *Attorney, Agent, or Firm*—Ira Lee Zebrak; Ting-Mao Chao

(57) ABSTRACT

A method is described of treating a gas stream exhausted from an atomic layer deposition (ALD) process chamber to which two or more gaseous precursors are alternately supplied. Between the process chamber and a vacuum pump used to draw the gas stream from the chamber, the gas stream is conveyed to a gas mixing chamber, to which a reactant is supplied for reacting with one of the gaseous precursors to form solid material. The gas stream is then conveyed to a cyclone separator to separate solid material from the gas stream. By deliberately reacting a non-reacted precursor to form solid material upstream from the pump, reaction within the pump of the non-reacted precursor and a second non-reacted precursor subsequently drawn from the chamber by the pump can be inhibited.

9 Claims, 3 Drawing Sheets

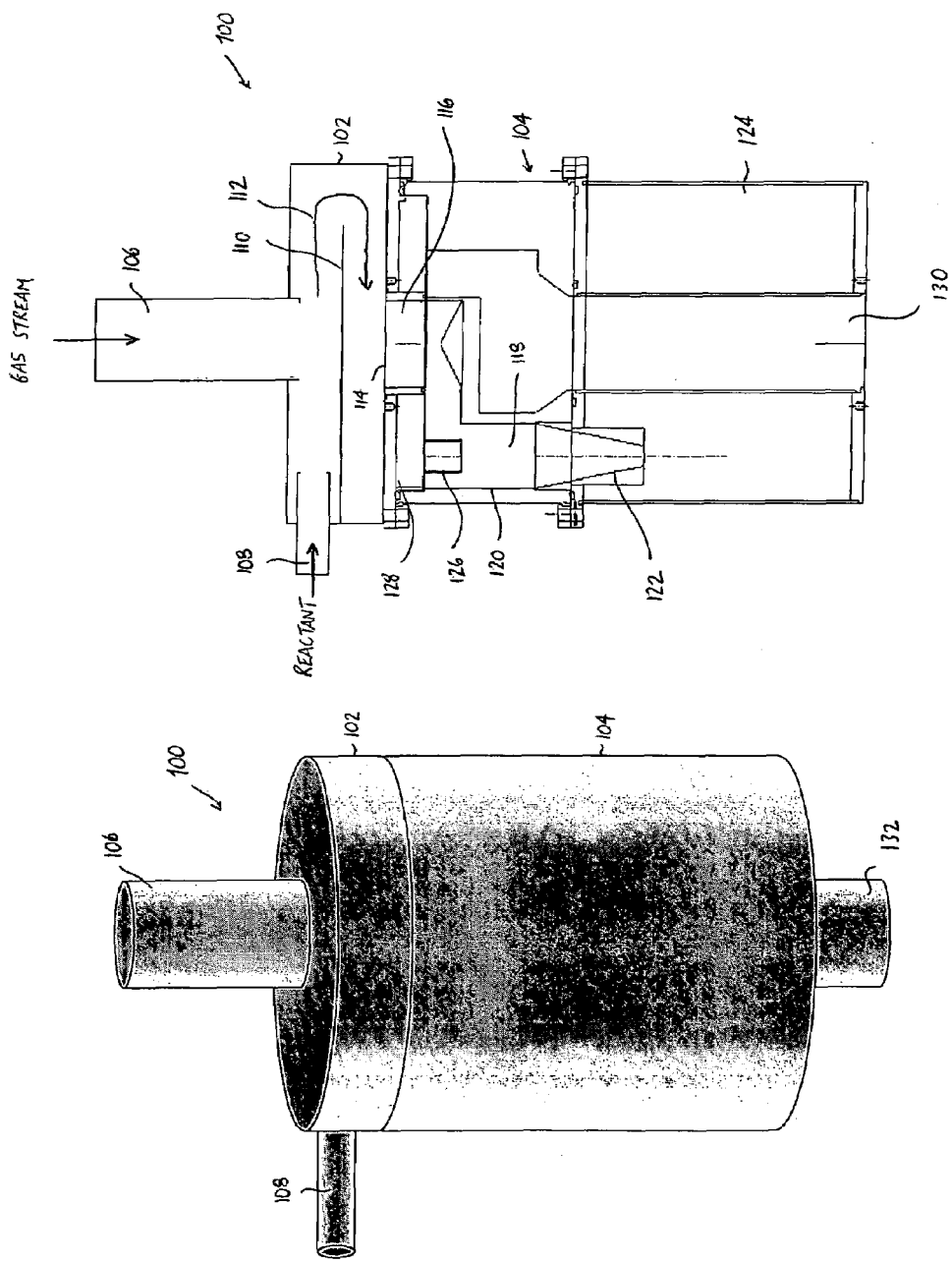

METHOD OF TREATING A GAS STREAM

BACKGROUND OF THE INVENTION

The present invention relates to a method of, and apparatus for, treating a gas stream, and finds particular use in treating a gas stream exhausted from a process chamber in which a pulsed gas delivery system is used to supply gases to the process chamber.

Pulsed gas delivery systems are commonly used in the formation of multi-layer thin films on a batch of substrates located in a process chamber. One such technique for forming thin films on substrates is atomic layer deposition (ALD), in which gaseous reactants, or "precursors", are sequentially delivered to a process chamber to form very thin layers, usually on an atomic-layer scale, of materials on the substrates.

By way of example, a high dielectric constant capacitor may be formed on a silicon wafer using an ALD technique through the sequential deposition of hafnium oxide ($HfO_2$) and aluminium oxide ($Al_2O_3$) thin films. $HfO_2$ thin films may be formed by the sequential supply of a hafnium precursor, such as tetrakis(ethylmethylamino)hafnium (TEMAH), and an oxidant, such as ozone ($O_3$), to the process chamber, and $Al_2O_3$ thin films may be formed by the sequential supply of an aluminium precursor, such as trimethyl aluminium (TMA), and $O_3$ to the chamber.

In overview, the first precursor delivered to the process chamber is adsorbed on to the surfaces of the substrates within the process chamber. The non-adsorbed first precursor is drawn from the process chamber by a vacuum pumping system, and the second precursor is then delivered to the process chamber for reaction with the first precursor to form a layer of deposited material. In the deposition chamber, the conditions immediate to the substrates are optimised to minimise gas-phase reactions and maximise surface reactions for the formation of a continuous film on each substrate. Any non-reacted second precursor and any by-products from the reaction between the precursors is then removed from the process chamber by the pumping system. Depending on the structure being formed within the process chamber, the first precursor, or a third precursor, is then delivered to the process chamber.

A purge step is typically carried out between the delivery of each precursor, for example by delivering a purge gas, such as $N_2$ or Ar, to the chamber between the delivery of each precursor. The purpose of the purge gas delivery is to remove any residual precursor from the process chamber so as to prevent unwanted reaction with the next precursor supplied to the chamber.

In practice, only around 5% or less of the precursors supplied to the process chamber are consumed during the deposition process, and so the gas drawn from the chamber during the process chamber will, between supplies of purge gas to the chamber, alternately be rich in the first precursor, and then rich in the second precursor.

In convention vacuum pumping systems, the gases drawn from the process chamber enter a common foreline leading to a vacuum pump. In the event that the non-reacted precursors meet within the vacuum pumping system, cross-reaction of the precursors can occur, and this can result in both the deposition of solid material and the accumulation of powders within the foreline and the vacuum pump. Particulates and powders that have accumulated within the pump can effectively fill the vacant running clearance between the rotor and stator elements of the pump, leading to a loss of pumping performance and ultimately pump failure. Periodic pump cleaning or replacement is then required to maintain pumping performance, resulting in costly process downtime and increasing manufacturing costs.

One aim of the present invention is to seek to solve this problem.

BRIEF SUMMARY OF THE INVENTION

In a first aspect, the present invention provides a method of treating a gas stream exhausted from a process chamber to which a first gaseous precursor and a second gaseous precursor are alternately supplied, the method comprising the steps, upstream from a vacuum pump used to draw the gas stream from the chamber, of conveying the gas stream to a gas mixing chamber, supplying to the gas mixing chamber a reactant for reacting with one of the first and second gaseous precursors to form solid material, and subsequently conveying the gas stream to a separator to separate solid material from the gas stream.

By deliberately reacting, say, unconsumed first gaseous precursor to form solid material, for example particulates and/or dust, before it reaches the pump, reaction within the pump of the unconsumed first gaseous precursor and unconsumed second gaseous precursor subsequently drawn from the chamber by the pump can be inhibited. The separator serves to separate from the gas stream solid material produced from the reaction between the unconsumed first gaseous precursor and the reactant. The separator may be provided by any trap device for removing solid material from a gas stream. One example is a dead-leg type of trap device. In the preferred embodiment, the separator is provided by a cyclone separator. An advantage associated with the use of a cyclone separator to separate the solid material from the gas stream is that the solid material will settle out in the bottom of the cyclone separator without increasing the impedance of the separator to the flow of the gas stream. Two or more cyclone separators may be provided in parallel to increase gas conductance.

The reaction between the reactant and the first gaseous precursor will take a finite amount of time, and so the gas mixing chamber is preferably configured to define a tortuous path for the mixture of the reactant and the gas stream to increase the residence time of the gas mixture within the gas mixing chamber, and to optimise mixing. At least one of the gas mixing chamber and the reactant may be heated to increase the rate of reaction between the reactant and the first gaseous precursor. The separator may also be heated to complete the reaction between the reactant and the first gaseous precursor. In one preferred embodiment, the gas mixing chamber is integral with the separator.

The reactant is preferably a gas that is relatively cheap, safe and readily available. In the preferred embodiment, in order to minimise the number of gas supplies the reactant is the second gas precursor, which is supplied from a second precursor supply both to the process chamber and to the gas mixing chamber for reaction with the first gaseous precursor. In this case, the reactant may be either an oxidising agent or a reducing agent used in the process conducted within the process chamber. In the preferred embodiment, the reactant is an oxidising agent, such as ozone, and the first gaseous precursor is an organometallic precursor, which may comprise one of hafnium and aluminium. Examples include tetrakis(ethylmethylamino)hafnium (TEMAH) and trimethyl aluminium (TMA).

In a second aspect the present invention provides a method of treating a gas stream exhausted from a process chamber, the method comprising the steps of adding to the gas stream a reactant for reacting with a gaseous component of the gas stream to form solid material, and subsequently conveying the gas stream to a separator to separate solid material from the gas stream.

In a third aspect, the present invention provides apparatus for treating a gas stream exhausted from a process chamber to which a first gaseous precursor and a second gaseous precursor are alternately supplied, the apparatus comprising a gas mixing chamber for receiving the gas stream from the process chamber, a reactant supply for supplying to the mixing chamber a reactant for reacting with one of the first and second gaseous precursors to form solid material, and a separator for receiving the gas stream from the gas mixing chamber and separating solid material from the gas stream.

In a fourth aspect, the present invention provides an atomic layer deposition apparatus comprising a process chamber, a first gaseous precursor supply for supplying a first gaseous precursor to the chamber, a second gaseous precursor supply for supplying a second gaseous precursor to the chamber, a vacuum pump for drawing a gas stream from the process chamber, and, between the process chamber and the vacuum pump, a gas mixing chamber for receiving the gas stream from the process chamber and second gaseous precursor from the second precursor gas supply for reacting with first gaseous precursor within the gas stream to form solid material, and a separator for receiving the gas stream from the gas mixing chamber and separating solid material from the gas stream.

Features described above in relation to method aspects of the invention are equally applicable to apparatus aspects, and vice versa.

BRIEF DESCRIPTION OF THE DRAWINGS

Preferred features of the present invention will now be described, by way of example only, with reference to the accompanying drawings, in which:

FIG. 3 illustrates an external view of a trap device comprising a gas mixing chamber and a cyclone separator; and FIG. 4 illustrates a cross-sectional view of the trap device of FIG. 3.

DETAILED DESCRIPTION OF THE INVENTION

Figure 1:
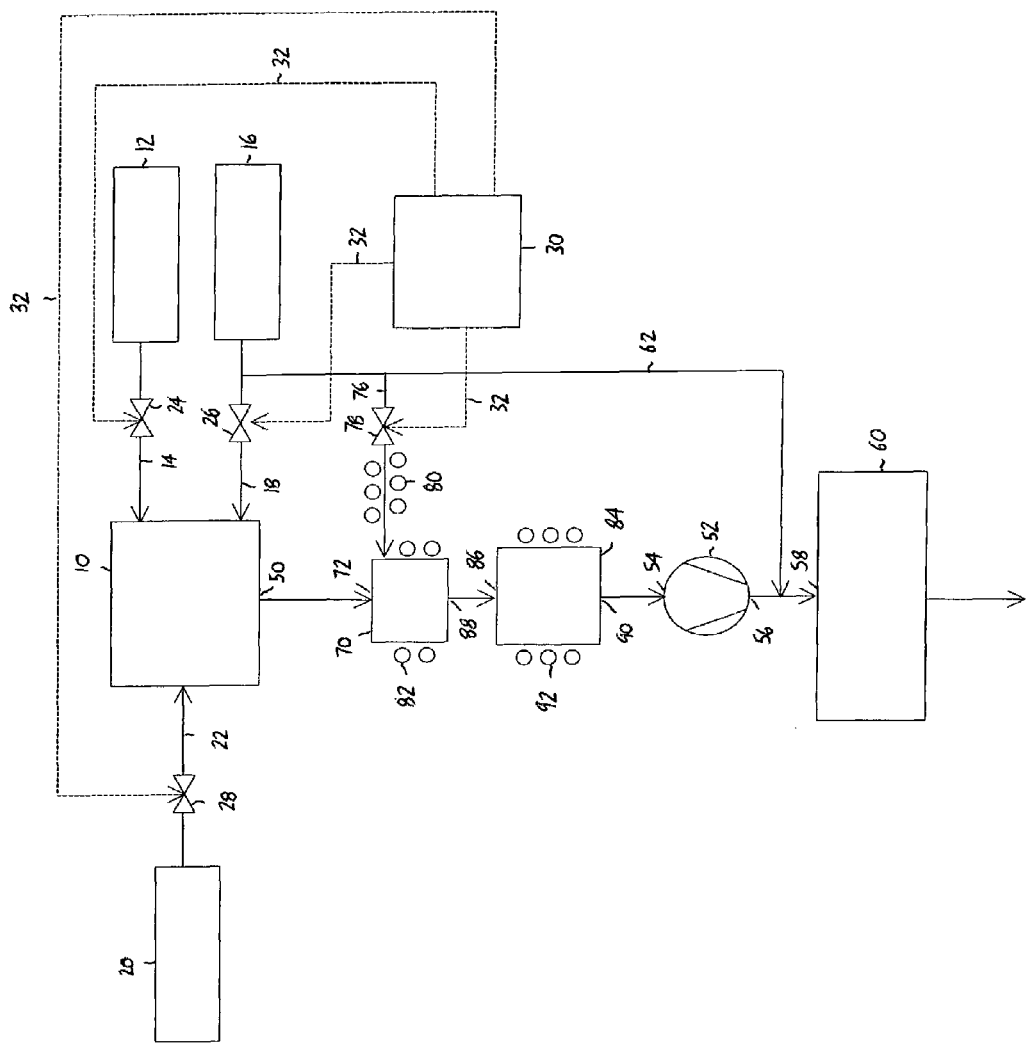
FIG. 1 illustrates schematically an atomic layer deposition apparatus.

With reference first to FIG. 1, an atomic layer deposition (ALD) apparatus comprises a process chamber 10 for receiving a batch of substrates to be processed simultaneously within the process chamber 10. The process chamber 10 receives separately and alternately two or more different gaseous reactants or precursors for use in forming layers of material on the exposed surfaces of the substrates. In the example illustrated in FIG. 1, a first precursor supply 12 is connected to the process chamber 10 by a first precursor supply line 14 for supplying a first precursor to the process chamber 10, and a second precursor supply 16 is connected to the process chamber 10 by a second precursor supply line 18 for supplying a second precursor to the process chamber 10. A purge gas supply 20 is also connected to the process chamber 10 by a purge gas supply line 22 for supplying a purge gas such as nitrogen or argon to the process chamber 10 between the supply of the precursors to the process chamber 10.

Figure 2:
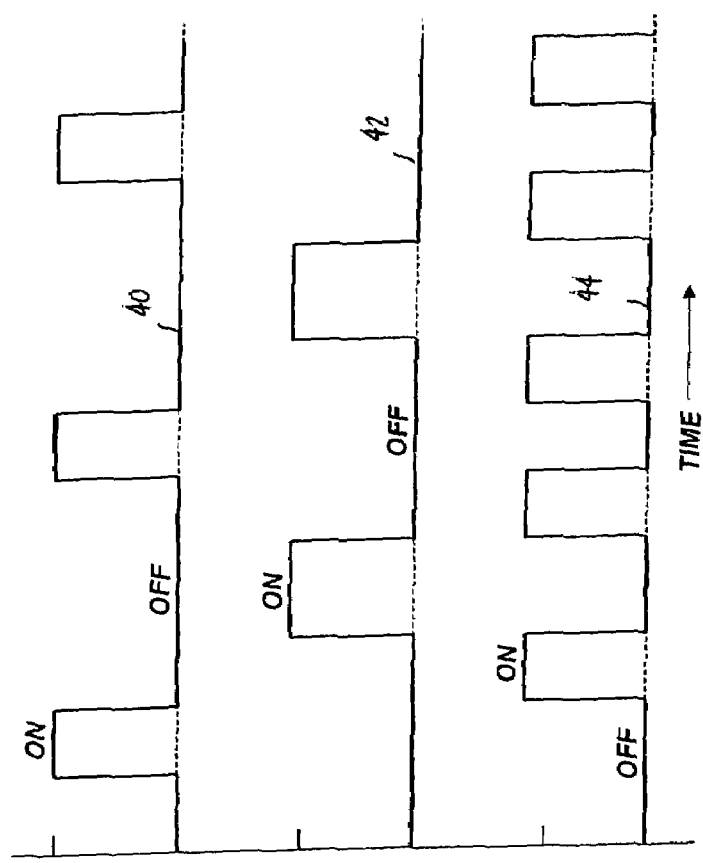
FIG. 2 illustrates the sequence of supply of gases to the process chamber of the apparatus of FIG. 1.

The supply of the precursors and the purge gas to the process chamber 10 is controlled by the opening and closing of gas supply valves 24, 26, 28 located in the supply lines 14, 18, 22 respectively. The operation of the gas supply valves is controlled by a supply valve controller 30 which issues control signals 32 to the gas supply valves to open and close the valves according to a predetermined gas delivery sequence. A typical gas delivery sequence involving two gaseous precursors and a purge gas is illustrated in FIG. 2. The first trace 40 represents the stepped delivery sequence for the first gaseous precursor, and the second trace 42 represents the stepped delivery sequence for the second gaseous precursor. As described above, the first and second precursors are alternately supplied to the chamber to form layers of solid material on the batches of substrates located within the process chamber 10. The duration of each pulsed delivery of precursor to the process chamber 10 is defined for the particular process to be performed within the process chamber 10; in this example, the duration of each pulsed delivery of the second precursor to the process chamber 10 is longer than that for the first precursor. The third trace 44 represents the stepped delivery sequence for the purge gas that is introduced into the process chamber 10 between the delivery of first and second gaseous precursors to flush the process chamber 10 before introducing the next gaseous precursor.

Returning to FIG. 1, a vacuum pumping system is connected to the outlet 50 of the process chamber 10 for drawing a gas stream from the process chamber 10. The pumping system comprises a vacuum pump 52 for receiving the gas stream through an inlet 54 thereof and exhausting the gas stream at an elevated pressure through an exhaust 56 thereof. The gas stream exhausted from the vacuum pump 52 is conveyed to an inlet 58 of an abatement device 60, for example a thermal processing unit or a wet scrubber, for removing one or more species from the gas stream before it is exhausted to the atmosphere.

In one example, the first gaseous precursor is an organometallic precursor containing one of hafnium and aluminium, such as tetrakis(ethylmethylamino)hafnium (TEMAH) or trimethyl aluminium (TMA), and the second gaseous precursor is an oxidant, such as ozone. The second precursor supply 16 may therefore be provided by an ozone generator. Currently available ozone generators can be difficult to start and stop in synchronisation with the pulsed delivery sequence of ozone to the process chamber 10. In view of this, the ozone generator 16 may be continuously generating ozone during the ALD process, and when ozone is not being delivered to the process chamber 10 the ozone may be diverted along ozone supply line 62 to a location downstream from the vacuum pump 52, for example to the inlet of a backing pump (not illustrated) provided between the vacuum pump 52 and the abatement device 60, or directly to a second inlet of the abatement device 60, where the ozone may assist in the abatement of the gas stream exhausted from the vacuum pump 52.

In view of the alternating supply of first and second gaseous precursors to the process chamber 10, the gas stream drawn from the process chamber 10 will alternate between a first precursor-rich gas stream, comprising unconsumed first precursor and by-products from the reaction between the precursors, and a second precursor-rich gas stream, comprising unconsumed second precursor and the by-products, with a purge gas-rich gas stream being drawn from the process chamber 10 between these precursor-rich gases. Each of the precursor-rich gas streams is also likely to contain traces of purge gas and other contaminants.

In order to inhibit mixing of the unconsumed precursors within the vacuum pump 52, which could lead to undesirable reaction between the precursors and the formation of dust and/or powders within the vacuum pump, apparatus is provided between the outlet 50 of the process chamber 10 and the inlet 54 of the vacuum pump 52 to treat the gas stream exhausted from the process chamber 10 so as to reduce the amount of one of the first and second precursors that enters the vacuum pump 52. In the example illustrated in FIG. 1, the amount of the first precursor entering the vacuum pump 52 is reduced.

The apparatus for treating the gas stream exhausted from the process chamber 10 comprises a gas mixing chamber 70 having a first inlet 72 for receiving the gas stream exhausted from the process chamber 10, and a second inlet 74 for receiving a reactant for reacting with the chosen precursor to be at least partially removed from the gas stream. In the illustrated example, a reactant supply for supplying the reactant to the gas mixing chamber 70 is conveniently provided by the ozone generator 16, with a reactant supply line 76 being connected between the ozone supply line 62 and the second inlet 74 of the gas mixing chamber 70 to supply ozone to the gas mixing chamber 70 as the reactant. The supply of reactant to the gas mixing chamber 70 is controlled by the opening and closing of reactant supply valve 78 located in the reactant supply line 76. The operation of the reactant supply valve 78 is controlled by a supply valve controller 30, which issues control signals 32 to the reactant supply valve 78 to open and close in synchronisation with the delivery of the first gaseous precursor to the process chamber 10, so that the reactant is supplied to the gas mixing chamber 70 with a stepped delivery sequence that is similar to that for the first gaseous precursor. The amount of reactant periodically delivered to the gas mixing chamber 70 is preferably at least sufficient to react with the amount of the first gaseous precursor that is supplied to the process chamber 10.

In order to increase the reaction rate between the reactant and the first gaseous precursor within the gas mixing chamber 70, at least one of the reactant and the gas mixing chamber 70 may be heated. With reference to FIG. 1, a first heater 80 may optionally extend about the reactant supply line 76 for heating the reactant before it is supplied to the gas mixing chamber 70, and a second heater 82 may optionally extend about the gas mixing chamber 70 for heating the gas mixing chamber 70.

The reactant is preferably chosen to replicate a reaction that would occur between unconsumed first and second gaseous precursors within the vacuum pump 52. Therefore, a product from the reaction between the reactant and the first gaseous precursor is the solid material, such as a dust and/or powder, that would otherwise be formed in the vacuum pump 52 through the reaction between the unconsumed precursors. Consequently, the apparatus for treating the gas stream exhausted from the process chamber 10 comprises a separator 84 having an inlet 86 connected to an outlet 88 of the gas mixing chamber 70. In one embodiment, the separator is a cyclone separator, which receives the solid material-laden gas stream from the gas mixing chamber 70, and, in a manner known in the art, separates the solid material from the gas stream, retaining the solid material therewithin and exhausting the gas stream from an outlet 90 thereof to the inlet 54 of the vacuum pump 52. As illustrated in FIG. 1, a third heater 92 may optionally be provided around the separator 84 for heating the separator 84 to promote reaction between any remaining unconsumed first gaseous precursor and the reactant.

In the example illustrated in FIG. 1, the gas mixing chamber 70 is separate from the separator 84. However, the gas mixing chamber 70 may be mounted on, or integral with, the separator 84. An example of a trap device 100 comprising a gas mixing chamber 102 mounted on a cyclone separator 104 is illustrated in FIGS. 3 and 4. The trap device 100 comprises a first inlet 106 for receiving the gas stream drawn from the process chamber 10 by the vacuum pump 52, and a second inlet 108 for receiving the gaseous reactant for reacting with the chosen unconsumed precursor contained within the gas stream. As illustrated in FIG. 1, a heater (not shown) may be located around the trap device 100 for heating at least one of the gas mixing chamber 102 and the cyclone separator 104.

The gas stream and the gaseous reactant enter the gas mixing chamber 102, wherein the gas streams combine. A baffle 110 located within the gas mixing chamber 102 causes the combined gas stream to turn through 180° as it passes through the gas mixing chamber 102, and thereby defines a tortuous flow path 112 for the combined gas stream passing through the gas mixing chamber 102. The turbulence created in the combined gas stream by the baffle 110 serves to both increase the residence time for the combined gas stream within the gas mixing chamber 102, and optimise the mixing of the gaseous reactant with the unconsumed gaseous precursor to promote reaction between the reactant and the unconsumed precursor to form solid material, such as particulates and/or powder.

The now solid material-laden gas stream passes through an outlet 114 of the gas mixing chamber 102 and enters the cyclone separator 104 through an inlet 116 thereof. The cyclone separator 104 comprises at least one separating chamber 118 for receiving the solid material-laden gas stream from the inlet 116. In one preferred embodiment, the cyclone separator 104 comprises at least six separating chambers 118 located circumferentially within the cyclone separator 104 each for receiving a portion of the solid material-laden gas stream from the inlet 116.

Each of the separating chambers 118 comprises a cylindrical upper portion 120 and a conical lower portion 122. A removable, annular particulate collecting chamber 124 is located beneath the separating chambers 118 for receiving solid material in the form of particulates, powder and/or dust that is separated from the solid material-laden gas stream within the separating chamber 118. As is well known in the art of cyclone separators, the solid material-laden gas stream that enters the separating chamber 118 spirals downwardly along the inner wall surface of the separating chamber 118. At the lower portion of the separating chamber 118, the flow of gas is turned upwardly to form a spiral upward flow along the centre of the separating chamber 118. During this process, the solid material in the gas stream is separated from the gas under the influence of the centrifugal force of the spiral gas flow, and falls down along the inner wall surface of the separating chamber 118 to be collected in the particle collecting chamber 124.

An outlet pipe 126 extends downwardly into the cylindrical upper portion 120 of the separating chamber 118 for receiving the gas stream from the separating chamber 118 and conveying the gas stream into an annual plenum chamber 128. The plenum chamber 128 receives gas from each of the separating chambers 118 and exhausts the gas into a central outlet pipe 130 through which the gas stream flows to the outlet 132 of the trap device 100.

A sensor (not shown) may be provided in association with the particle collecting chamber 124. The sensor 34 may be in the form of a level sensor for outputting a signal indicative of the level of solid material collected within the particle collecting chamber 124. Alternatively, the sensor may be in the form of a load cell for monitoring the weight of solid material collected by the particle collecting chamber 124, a temperature sensor, a vibration sensor or any other suitable sensor. In use, the sensor outputs a signal to a controller indicative of the amount of solid material collected by the trap device 100. When the monitored amount reaches or exceeds a predetermined value, the controller may generate a visual or audible alert to a user to indicate that servicing of the trap device 100 is required. The particle collecting chamber 124 may be disconnected from the trap device 100 by the user. Alternatively, the particle collecting chamber 124 may be provided with an access port selectively closable by a door or other movable member for providing external access to the particulates collected by the trap device 100. For example, the bottom wall of the particle collecting chamber 124 may be pivotally connected to the side wall of the chamber so that, when the trap device 100 requires servicing, the particle collecting chamber 124 can be opened to allow the collected particulates to fall from the particle collecting chamber 124 into a suitable receptacle placed thereunder. Alternatively, safety may be improved by providing a closable access port or slot at a position above the particulate level at which the alert is generated, and inserting a suction device into the particle collecting chamber 124 via the access port to remove the collected particulates therefrom.

While the description above and the system shown in FIG. 1 show a single separator, the present invention also contemplates the use of two or more separators, or two or more trap devices that may be provided in parallel to enable one of the separators, or trap devices, to be serviced while the other is operational, thereby enabling continuous operation.

It is anticipated that other embodiments and variations of the present invention will become readily apparent to the skilled artisan in the light of the foregoing description and examples, and it is intended that such embodiments and variations likewise be included within the scope of the invention as set out in the appended claims.

The invention claimed is:

1. A method of treating an exhaust gas stream from a process chamber to which a first precursor gas and a second precursor gas are alternately supplied, the method comprising:
    conveying the gas stream to a gas mixing chamber;
    heating a reactant prior to supplying the reactant to the gas mixing chamber;
    supplying the reactant to the gas mixing chamber;
    reacting the reactant with one of the first precursor gas or the second precursor gas to form solid material;
    conveying the gas stream to a separator; and
    separating the solid material from the gas stream;
    wherein the gas mixing chamber is upstream of a vacuum pump used to draw the gas stream from the process chamber and wherein the reactant is the same as the second precursor gas and the reactant reacts with the first precursor gas.

2. The method according to claim 1, further comprising heating at least one of the gas mixing chamber or the separator.

3. The method according to claim 1, wherein the gas mixing chamber is integral with the separator.

4. The method according to claim 1, wherein the reactant is an oxidant.

5. The method according to claim 4, wherein the reactant is ozone.

6. The method according to claim 1, wherein the first precursor gas or the second precursor gas is an organometallic precursor.

7. The method according to claim 6, wherein the organometallic precursor is hafnium or aluminium.

8. The method according to claim 1, wherein the separator is a cyclone separator.

9. A method of treating an exhaust gas stream from a process chamber to which a first precursor gas and a second precursor gas are alternatively supplied, comprising:
    adding a reactant to the gas stream in a gas mixing chamber;
    heating the reactant prior to adding the reactant to the gas stream in the gas mixing chamber
    reacting the reactant with one of the first precursor gas or the second precursor gas to form a solid material;
    conveying the gas stream to a separator; and
    separating the solid material from the gas stream;
    wherein the reactant is the same as the second precursor gas and the reactant reacts with the first precursor gas.

* * * * *